United States Patent
Lee et al.

(10) Patent No.: US 8,218,379 B2
(45) Date of Patent: Jul. 10, 2012

(54) SEMICONDUCTOR DEVICE HAVING RESISTANCE BASED MEMORY ARRAY, METHOD OF OPERATION, AND SYSTEMS ASSOCIATED THEREWITH

(75) Inventors: Yong-Jun Lee, Anyang-si (KR); Kwang-Jin Lee, Hwaseong-si (KR); Taek-Sung Kim, Yongin-si (KR); Kwang-Ho Kim, Hwaseong-si (KR); Woo-Yeong Cho, Suwon-si (KR); Hyun-Ho Choi, GeongGi-do (KR); Hye Jin Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 377 days.

(21) Appl. No.: 12/318,241

(22) Filed: Dec. 23, 2008

(65) Prior Publication Data

US 2009/0168494 A1    Jul. 2, 2009

(30) Foreign Application Priority Data

Dec. 27, 2007 (KR) ......................... 10-2007-0138978

(51) Int. Cl.
   *G11C 16/04* (2006.01)
(52) U.S. Cl. ............... 365/189.16; 365/218; 365/185.29
(58) Field of Classification Search ............. 365/185.29, 365/218, 148, 189.16
See application file for complete search history.

(56) References Cited

U.S. PATENT DOCUMENTS

| 6,351,406 B1 | 2/2002 | Johnson et al. | |
|---|---|---|---|
| 6,545,906 B1 | 4/2003 | Savtchenko et al. | |
| 6,849,891 B1 | 2/2005 | Hsu et al. | |
| 7,282,759 B2 | 10/2007 | Kim et al. | |
| 2001/0019501 A1* | 9/2001 | Otani et al. | 365/185.29 |
| 2002/0089920 A1 | 7/2002 | Gotoh et al. | |
| 2004/0165442 A1* | 8/2004 | Lee et al. | 365/185.18 |
| 2007/0008769 A1 | 1/2007 | Kim et al. | |
| 2007/0195581 A1 | 8/2007 | Morimoto | |
| 2008/0239799 A1 | 10/2008 | Watanabe | |
| 2008/0270678 A1 | 10/2008 | Cornwell et al. | |
| 2009/0244976 A1* | 10/2009 | Kajimoto | 365/185.11 |

FOREIGN PATENT DOCUMENTS

| JP | 2005-149617 A | 6/2005 |
|---|---|---|
| JP | 2005-190201 | 7/2005 |
| JP | 2007-226883 A | 9/2007 |
| KR | 10-2003-0021631 | 3/2003 |
| KR | 10-2005-0107369 | 11/2005 |
| KR | 10-0610647 | 8/2006 |
| KR | 10-2007-0005823 A | 1/2007 |

OTHER PUBLICATIONS

U.S. Office Action mailed Jan. 4, 2012 for corresponding U.S. Appl. No. 12/646,345.

* cited by examiner

*Primary Examiner* — Vu Le
*Assistant Examiner* — Han Yang
(74) *Attorney, Agent, or Firm* — Harness, Dickey & Pierce, P.L.C.

(57) ABSTRACT

In one embodiment, the semiconductor device includes a non-volatile memory cell array, a write circuit configured to write to the non-volatile memory cell array, and a control circuit. The control circuit is configured to store at least one erase indicator. The erase indicator is associated with at least a portion of the non-volatile memory cell array and indicates a logic state. The control circuit is configured to control the write circuit to write the logic state indicated by the erase indicator in the non-volatile memory cell array during an erase operation of the associated portion of the non-volatile memory cell array.

18 Claims, 18 Drawing Sheets

Fig. 2

| 10-1 | 10-2 | 10-3 | 10-4 | 10-5 | 10-6 | 10-7 | 10-8 |
|------|------|------|------|------|------|------|------|
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |

# SEMICONDUCTOR DEVICE HAVING RESISTANCE BASED MEMORY ARRAY, METHOD OF OPERATION, AND SYSTEMS ASSOCIATED THEREWITH

PRIORITY INFORMATION

The subject application claims priority under 35 U.S.C. 119 on Korean application no. 10-2007-0138978 filed Dec. 27, 2007; the contents of which are hereby incorporated by reference in their entirety.

BACKGROUND

Embodiments relate to semiconductor devices having a resistance based memory array. For example, a resistance based memory array may be a PRAM (phase change material RAM), RRAM (resistive RAM), MRAM (magnetic RAM), etc.

SUMMARY OF THE INVENTION

The present invention relates to a semiconductor device.

In one embodiment, the semiconductor device includes a non-volatile memory cell array, a write circuit configured to write to the non-volatile memory cell array, and a control circuit. The control circuit is configured to store at least one erase indicator. The erase indicator is associated with at least a portion of the non-volatile memory cell array and indicates a logic state. The control circuit is configured to control the write circuit to write the logic state indicated by the erase indicator in the non-volatile memory cell array during an erase operation of the associated portion of the non-volatile memory cell array.

In another embodiment, semiconductor device is a flash compatible resistive memory, which includes a resistive memory array divided into memory blocks. Each memory block includes a plurality of resistive memory cells. A write circuit is configured to write to the non-volatile memory cell array. A control circuit is configured to store an erase indicator associated with each memory block, and each erase indicator indicates a logic state. The control circuit is configured to control the write circuit to write the logic state indicated by the erase indicator in the associated memory block during an erase operation of the associated memory block.

The present invention also relates to implementations of the semiconductor device.

For example, one example implementation is a card. In one embodiment, the card includes a memory and a control unit configured to control the memory. The memory includes a non-volatile memory cell array, a write circuit configured to write to the non-volatile memory cell array, and a control circuit. The control circuit is configured to store at least one erase indicator. The erase indicator is associated with at least a portion of the non-volatile memory cell array and indicates a logic state. The control circuit is configured to control the write circuit to write the logic state indicated by the erase indicator in the non-volatile memory cell array during an erase operation of the associated portion of the non-volatile memory cell array.

Another example implementation is a system. In one embodiment, the system includes a bus, a semiconductor device connected to the bus, an input/output device connected to the bus, and a processor connected to the bus. The processor is configured to communicate with the input/output device and the semiconductor device via the bus. The semiconductor device includes a non-volatile memory cell array, a write circuit configured to write to the non-volatile memory cell array, and a control circuit. The control circuit is configured to store at least one erase indicator. The erase indicator is associated with at least a portion of the non-volatile memory cell array and indicates a logic state. The control circuit is configured to control the write circuit to write the logic state indicated by the erase indicator in the non-volatile memory cell array during an erase operation of the associated portion of the non-volatile memory cell array.

The present invention further relates to a method of operating a semiconductor device.

In one embodiment, the method includes storing at least one erase indicator. The erase indicator is associated with at least a portion of a non-volatile memory cell array and indicating a logic state. The method further includes writing the logic state indicated by the erase indicator in the non-volatile memory cell array during an erase operation of the associated portion of the non-volatile memory cell array.

BRIEF DESCRIPTION OF THE DRAWINGS

The present invention will become more fully understood from the detailed description given herein below and the accompanying drawings, wherein like elements are represented by like reference numerals, which are given by way of illustration only and thus are not limiting of the present invention and wherein:

FIG. 2 illustrates a layout of the cell array in FIG. 1 according to one embodiment.

DETAILED DESCRIPTION OF EMBODIMENTS

Figure 1:
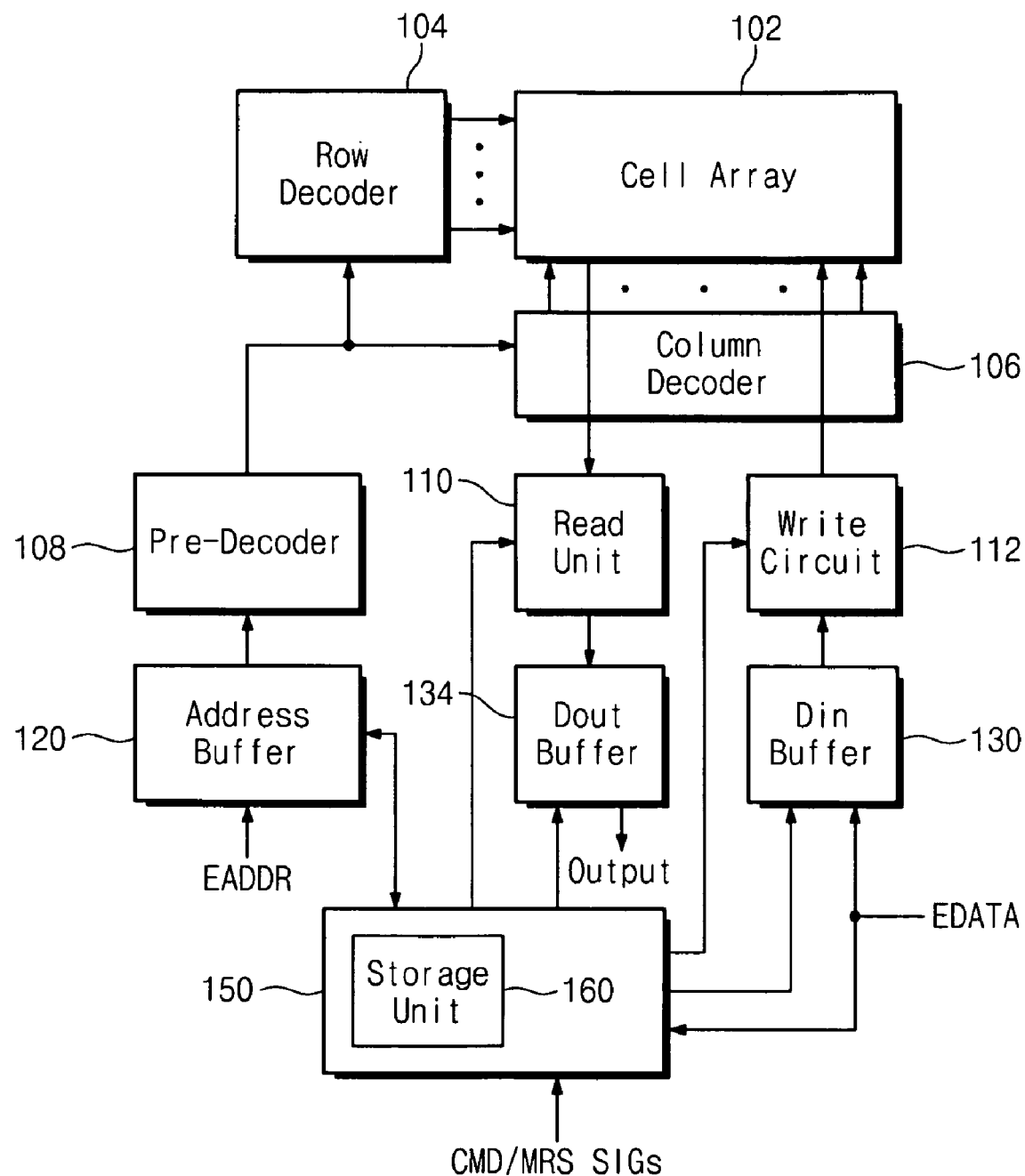
FIG. 1 illustrates a semiconductor device according to an example embodiment.

Example embodiments will now be described more fully with reference to the accompanying drawings. However, example embodiments may be embodied in many different forms and should not be construed as being limited to the example embodiments set forth herein. Example embodiments are provided so that this disclosure will be thorough, and will fully convey the scope to those who are skilled in the art. In some example embodiments, well-known processes, well-known device structures, and well-known technologies are not described in detail to avoid the unclear interpretation of the example embodiments. Throughout the specification, like reference numerals in the drawings denote like elements.

It will be understood that when an element or layer is referred to as being "on", "connected to" or "coupled to" another element or layer, it may be directly on, connected or coupled to the other element or layer, or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

There are numerous types of non-volatile memories. A newer type of non-volatile memory is a resistive material based memory array. For example, a resistance based memory array may be a PRAM (phase change material RAM), RRAM (resistive RAM), MRAM (magnetic RAM), etc. MRAMs use spin torque transfer phenomenon (STT). Spin torque transfer writing technology is a technology in which data is written by aligning the spin direction of the electrons flowing through a TMR (tunneling magneto-resistance) element. Data writing is performed by using a spin-polarized current with the electrons having the same spin direction. U.S. Pat. No. 6,545,906 discloses an example MRAM, and is incorporated herein by reference in its entirety.

RRAM or ReRAM takes advantage of controllable resistance changes in thin films of various resistance materials. For example, a dielectric, which is normally insulating, can be made to conduct through a filament or conduction path formed after application of a sufficiently high voltage. The conduction path formation can arise from different mechanisms, including defects, metal migration, etc. Once the filament is formed, the filament may be reset (broken, resulting in high resistance) or set (re-formed, resulting in lower resistance) by an appropriately applied voltage. During application of the appropriate voltage, resistance varies until the high resistance or low resistance state is achieved. U.S. Pat. Nos. 6,849,891 and 7,282,759 disclose example RRAMs, and are both incorporated herein by reference in their entirety.

PRAMs rely on the application of heat to phase change resistor cells to change the resistive state of the phase change resistor cells. Normally, a current is supplied to the phase change resistor cell to apply the heat. The amount and duration of the current establishes whether the phase change resistor cell achieves a low resistance state or achieves a high resistance state. The low resistive state is called a set state and may represent, for example, a logic low or '0' state. The high resistive state is called a reset state, and may represent, for example, a logic high or '1' state. GST or a chalcogenide alloy is a common phase change material used in the phase change resistor cells.

After application of heat to effect a state change, an amount of time must pass before the phase change material stabilizes in the set or reset states. Accordingly reading from a cell prior to the cell settling in the set or reset state may result in incorrect reading of data from the memory cell array.

Figure 3:
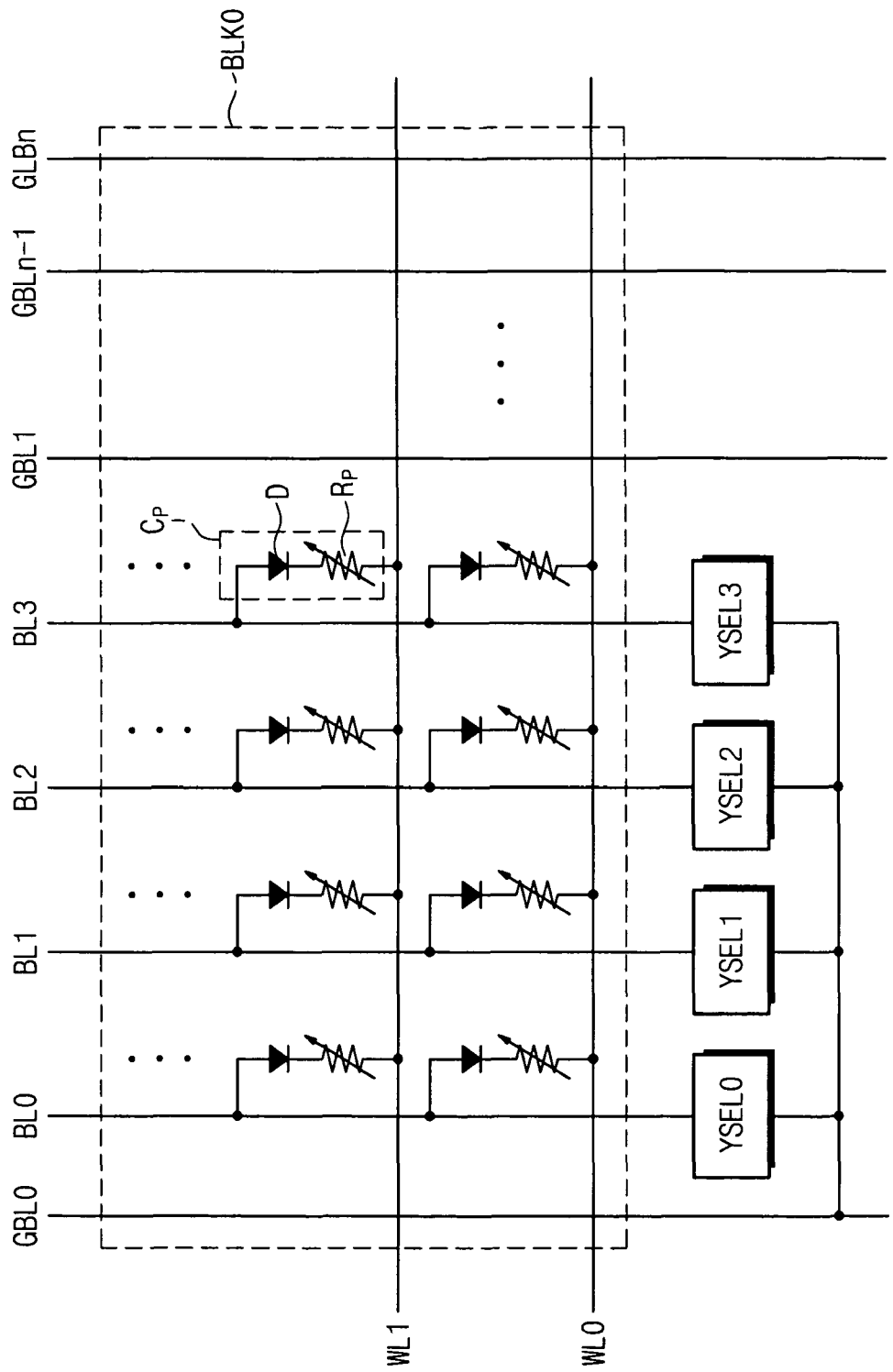
FIG. 3 illustrates a portion of memory block BLK0 in FIG. 2.

FIG. 1 illustrates a semiconductor device according to an embodiment. As shown, the semiconductor device includes a non-volatile memory cell array 102. In one embodiment, the non-volatile memory cell array 102 is a resistive material based memory cell array. For the purposes of example only, the memory cell array 102 will be described as being a phase change memory cell array (PRAM); however, it will be understood that the memory cell array 102 may be another applicable resistive material based memory array such as RRAM, MRAM, etc. FIG. 2 illustrates a layout of the cell array 102 according to one example embodiment. As shown, the memory cells in the array are divided into memory banks 10, and each memory bank 10 is divided into memory blocks BLKi. FIG. 3 illustrates a portion of memory block BLK0. It will be appreciated that the other memory blocks may be structured in the same manner. As shown, PRAM cells Cp are located at the intersections of word lines Wi (e.g., W1 and W2) and bit lines BLi (e.g., BL0, BL1, BL2, and BL3). Each PRAM cell Cp includes a current control device D and a phase change resistor cell Rp connected in series between a respective bit line BLi and a word line Wi. As shown, each current control device D is a diode, but may instead be a transistor. Furthermore, each phase change resistor cell Rp may be formed of phase change material disposed between two electrodes. The phase change material may be GeSbTe (GST), GaSb, InSb, InSe, $Sb_2Te_3$, GeTe, GeSbTe, GaSeTe, InSbTe, $SnSb_2Te_4$, InSbGe, AgInSbTe, (GeSn)SbTe, GeSb (SeTe), $Te_{81}Ge_{15}Sb_2S_2$, etc. It will be appreciated that the memory cells Cp may serve as multi-level cells (MLC). Here instead of just the set and reset states, the memory cell Cp may be programmed to states between the set and reset state such that the memory cell Cp stores more than 1 bit of data. For example, if four states exist, each state may represent two bits of data.

Furthermore, the present invention is not limited to any particular cell array structure, or use of a particular cell array structure with a particular resistance material based memory. Instead, any cell structure such as 3D, crosspoint, wafer stack, etc. may be implemented in the embodiments of the present invention. U.S. Pat. No. 6,351,406 discloses such an example cell structure, and is incorporated by reference herein in its entirety.

A column selector YSELi selectively connects each respective bit line BLi to a global bit line GBL0. This structure is repeated for several global bit lines GBLi. Furthermore, while only two word lines are shown, it will be appreciated that a single block BLKi may include more than two word lines, with the commensurate increase in PRAM cells Cp. Similarly, instead of four bit lines BLi being associated with each global bit line GBLi, more or less than four bit lines BLi may be associated with each global bit line GBLi.

Returning to FIG. 1, an external address EADDR is received and buffered by an address buffer 120 in association with command signal(s) received by a controller 150. The controller 150 decodes these into a write command, read command, etc. The controller 150 sends the read or write command to the address buffer 120. For write commands, the address buffer 120 stores and outputs the external address EADDR as a write address WADDR. For read commands, the address buffer 120 stores and outputs the external address EADDR as a read address RADDR.

A pre-decoder 108 pre-decodes the received read or write address into row and column addresses. A row decoder 104 further decodes the row address and selectively drives the word lines WLi in the memory cell array 102. A column decoder 106 further decodes the column address and selectively controls the column selectors YSELi to connect bit lines BLi to global bit lines GBLi.

During a write operation, externally supplied data EDATA is buffered by a data input buffer 130, and supplied as write WDATA to a write circuit 112 under the control of the controller 150. The write circuit 112, as instructed by the controller 150, writes the write data WDATA in the memory cell array 102 by supplying the appropriate currents and/or voltages to set or reset the memory cells consistent with the logic states of the write data WDATA. As discussed above, the memory cells being written are selected by the row and column decoders 104 and 106.

During a read operation, a read unit 110 shown in FIG. 1 reads the data from the addressed memory cell or cells, and outputs the read data to a data output driver 134. The data output driver 134 buffers the read data, and outputs the read data.

As discussed above, the controller 150 decodes a command, and controls the read operation by the read unit 110, the write operation by the write unit 112, etc. based on the decoded commands. The controller 150 also includes a storage unit 160. The storage unit 160 may store an erase indicator. The erase indicator indicates the logic state to which memory cells of the memory cell array 102 are to be erased. For example, the storage unit 160 may be a register.

The state of the erase indicator may be set in any manner. For example, the erase indicator may be programmable by applying a command or mode register set such that, in response, the controller 150 programs a received, desired erase indicator in the storage unit 160. The erase indicator may also be set in other ways such as through fuses, etc. Instead of the controller 150 receiving and programming the erase indicator in the storage unit 160, the storage unit 160 may directly receive a mode register set to program the erase indicator.

Figure 4:
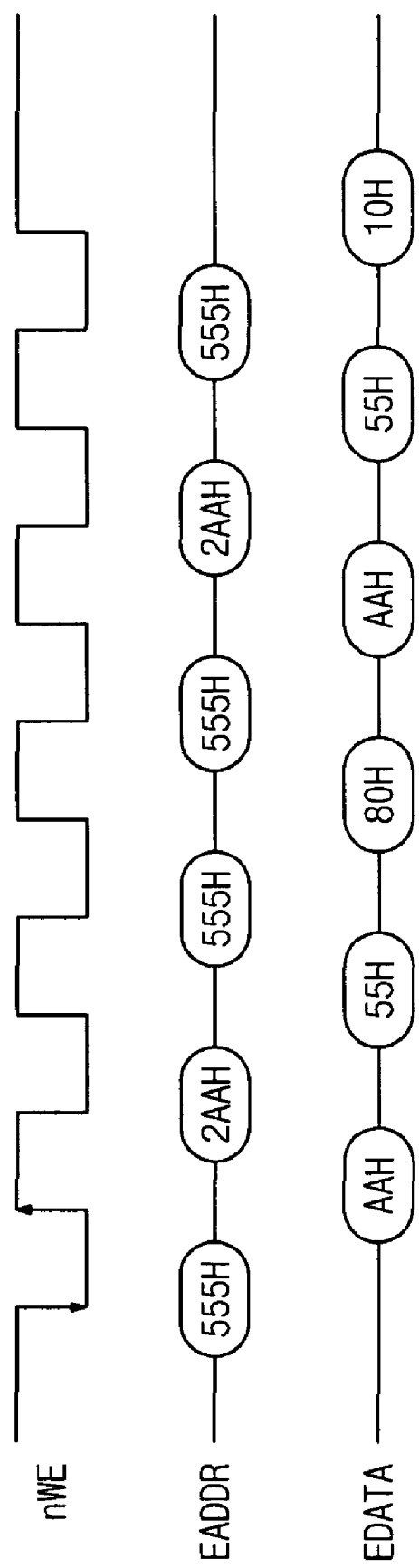
FIG. 4 illustrates a timing diagram showing one example of setting the erase indicator.

FIG. 4 illustrates a timing diagram showing one example of setting the erase indicator. In this embodiment, a write enable signal nWE is received as part of a command. External data EDATA is received on high-to-low transitions of a write enable signal nWE, and external addresses are received on low-to-high transitions of the write enable signal nWE. The external data and addresses received over the two cycles ending in EDATA of 80H establish an erase set up command, and the external data and addresses received over the next two cycles ending in EDATA 10H establish a chip erase command where the erase indicator is set to logic '0' or a logic low state. In this example, the erase indicator may be set to a logic '1' or a logic high state, by supplying EDATA of 11H instead of EDATA of 10H. While not shown, in the cycle following receipt of the EDATA establishing the state of the erase indicator, the erase indicator value is stored in the storage unit 160.

Figure 5:
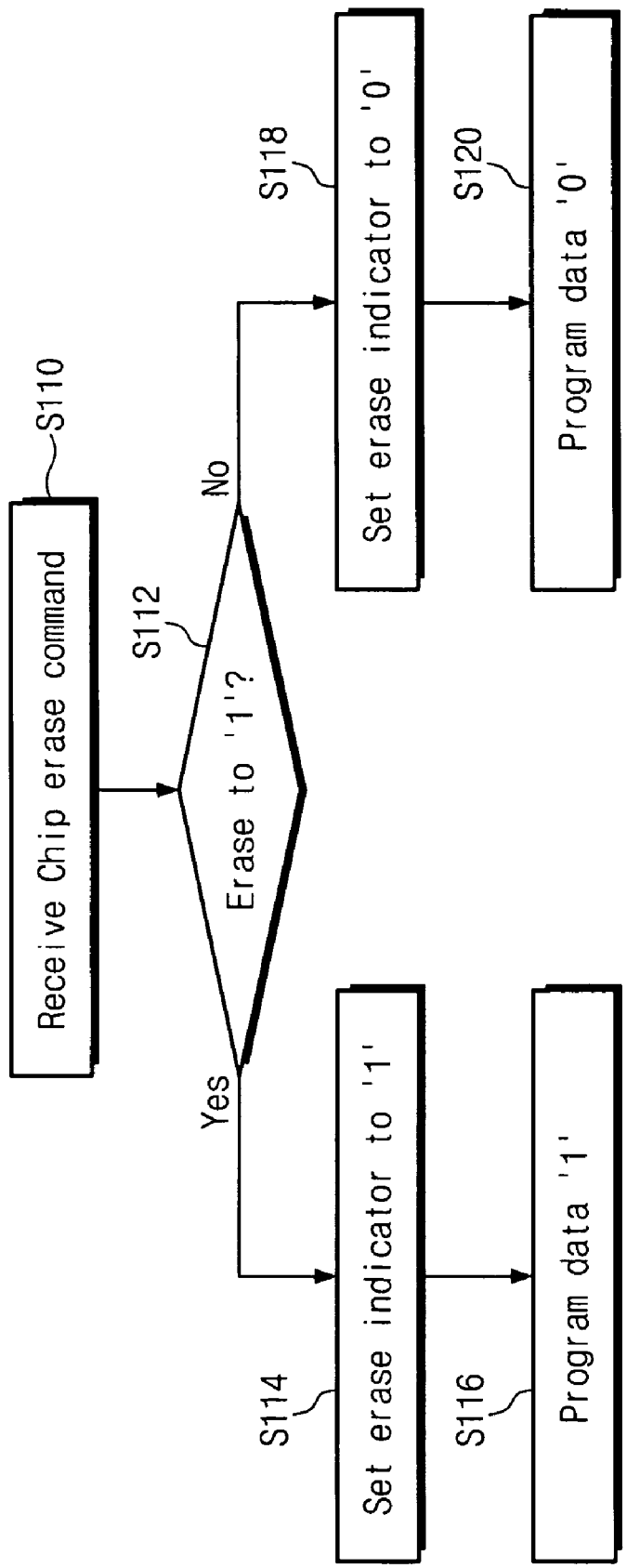
FIG. 5 illustrates an erase operation according to an example embodiment.

FIG. 5 illustrates an example chip erase operation according to an embodiment. As shown, in step S110, the controller 150 receives a chip erase command such as described above with respect to FIG. 4. Next, the controller 150 determines if the chip erase command indicates to erase to the logic '1' state in step S112. If so, then in step S114 the controller 150 sets the erase indicator in the storage unit 160 to logic '1', and controls the address buffer 120, the data input buffer 130 and the write circuit 112 to program the cells of the memory cell array 102 to a data value of '1' in step S116. For example, the controller 150 controls the address buffer 120 to output the addresses of the memory cells in the memory cell array, controls the data input buffer 130 to output a logic '1' as write data WDATA, and controls the write circuit 112 to program the cells of the memory cell array 102 to the set state indicated by the write data WDATA.

If the controller 150 determines in step S112 that the chip erase command does not indicate the logic '1' state, then in step S118 the controller sets the erase indicator in the storage unit 160 to logic '0' and controls the address buffer 120, the data input buffer 130 and the write circuit 112 to program the cells of the memory cell array 102 to a data value of '1' in step S120. For example, the controller 150 controls the address buffer 120 to output the addresses of the memory cells in the memory cell array, controls the data input buffer 130 to output a logic '0' as write data WDATA, and controls the write circuit 112 to program the cells of the memory cell array 102 to the reset state indicated by the write data WDATA.

While this embodiment was described as setting the erase indicator as part of a chip erase operation, the present invention is not limited to this embodiment. Instead, the erase indicator may be set before a chip erase operation. Also, even if the erase indicator is set during a chip erase operation, subsequent chip erase operations do not need to involved setting the erase indicator. Still further, if the erase indicator is set separately from the chip erase command, the chip erase command does not need to indicate an erase indicator value.

Figure 6:
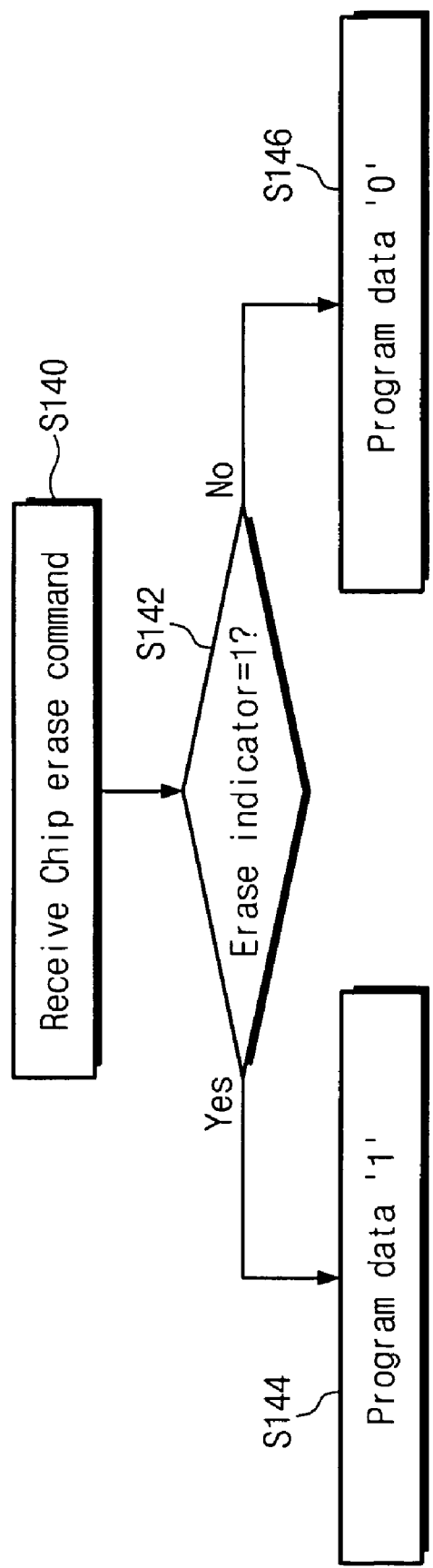
FIG. 6 illustrates an erase operation according to another example embodiment.

FIG. 6 illustrates an example chip erase operation according to another embodiment. In this embodiment, the erase indicator has been set prior to receipt of a chip erase command. As discussed above, the erase indicator may be set by applying a command, by applying a mode register set, by cutting fuses, etc. After receiving a chip erase command in step S140, the controller 150 accesses the erase indicator from the storage unit 160 and determines if the erase indicator is a logic '1' in step S142. If so, then the controller 150 controls the address buffer 120, the data input buffer 130 and the write circuit 112 to program the cells of the memory cell array 102 to a data value of '1' in step S144.

If the controller 150 determines in step S142 that the chip erase command does not have the logic '1' state, then in step S146 the controller 150 controls the address buffer 120, the data input buffer 130 and the write circuit 112 to program the cells of the memory cell array 102 to a data value of '0'.

Figure 7:
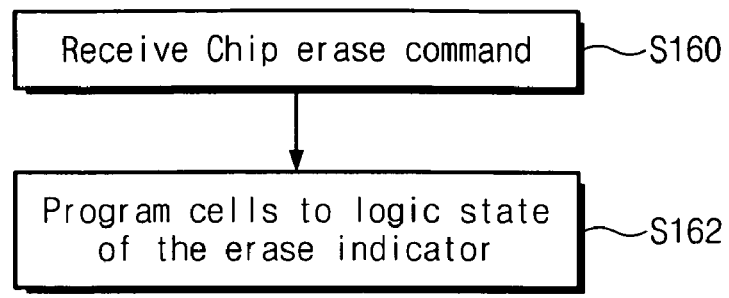
FIG. 7 illustrates an erase operation according to yet another example embodiment.

In the embodiments described above, the erase indicator state was the same as the programmed state for the erase operation, but as will be appreciated, the present invention is not limited to this implementation. However, if the erase indicator state is the same as the program state for the erase operation, then the chip erase operation may be performed as shown by the flow chart of FIG. 7. As shown, the controller 150 receives the chip erase command in step S160. Then, the controller 150 controls the address buffer 120, the data input buffer 130 and the write circuit 112 to program the cells of the memory cell array to the logic state of the erase indicator in step S162.

The above described embodiments were directed towards a chip erase operation in which all of the cells in the memory cell array 102 were erased to the state indicated by the erase indicator. However, the present invention is not limited in application to a chip erase operation. Instead, the present invention may be applied to erasing less than all of the cells in the memory cell array 102.

Figure 8:
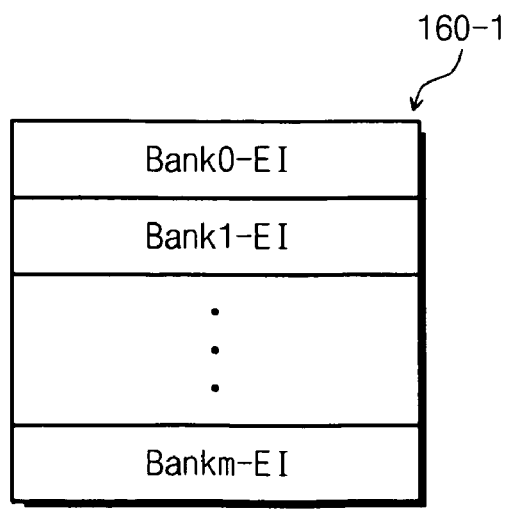
FIGS. 8-9 illustrate example embodiments of the storage unit in FIG. 1.

As discussed above, in one embodiment, the memory cell array 102 is divided into banks 10, and each memory bank 10 is divided into memory blocks BLKi. According to one embodiment, the storage unit 160 of FIG. 1 may be replaced with the storage unit 160-1 shown in FIG. 8. As shown, the storage unit 160-1 includes an erase indicator for each bank in the memory cell array 102. Each bank erase indicator may be set by applying a command, by applying a mode register set, by cutting fuses, etc. As such, different banks may be erased to the same logic state or erased to different logic states.

In this embodiment, the controller 150 may receive a bank erase command. The bank erase command identifies the bank to be erased. Any of the embodiments of FIGS. 5-7 may be performed in the same manner but a bank erase command identifying a bank is received instead of a chip erase command and only the bank identified in the bank erase command is erased to the state indicated by the associated bank erase indicator. Still further, a chip erase operation may still be performed. During a chip erase operation, the controller 150 controls the address buffer 120, the write circuit 112 and the data input buffer 130 to erase each bank to the state indicated by each associated bank erase indicator in response to a chip erase command.

Figure 9:
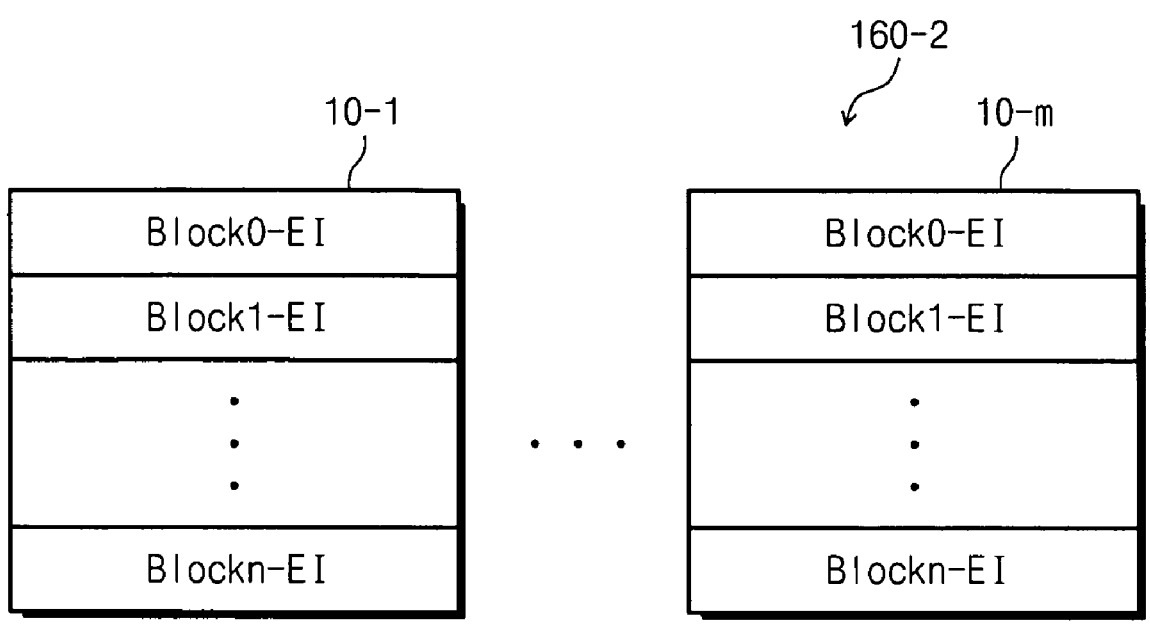

According to another embodiment, the storage unit 160 of FIG. 1 may be replaced with the storage unit 160-2 shown in FIG. 9. As shown, for each bank 10 in memory cell array 102, the storage unit 160-2 includes an erase indicator for each block. Each block erase indicator may be set by applying a command, by applying a mode register set, by cutting fuses, etc. As such, different blocks may be erased to the same logic state or erased to different logic states.

In this embodiment, the controller 150 may receive a block erase command. The block erase command identifies the block to be erased. Namely, the block erase command identifies which block in which bank to erase. Any of the embodiments of FIGS. 5-7 may be performed in the same manner but a block erase command identifying a block is received instead of a chip erase command and only the block identified in the block erase command is erased to the state indicating by the associated block erase indicator. Still further, a chip erase operation may still be performed. During a chip erase operation, the controller 150 controls the address buffer 120, the write circuit 112 and the data input buffer 130 to erase each block to the state indicated by each associated block erase indicator in response to a chip erase command. Even further, a bank erase operation may be performed. During a bank erase operation, the controller 150 controls the address buffer 120, the write circuit 112 and the data input buffer 130 to erase each block in the identified bank to the state indicated by each associated block erase indicator in response to a bank erase command.

A conventional flash memory performs a block erase operation prior to writing or programming data in a block. Accordingly, the controller 150 may control the operation of the semiconductor device of FIG. 1 such that the semiconductor device operates in the same manner as a convention flash memory. Namely, the controller 150 may control the operation of the semiconductor device of FIG. 1 such that semiconductor device provides a compatible flash memory, and may substitute for conventional flash memory.

Figure 10:
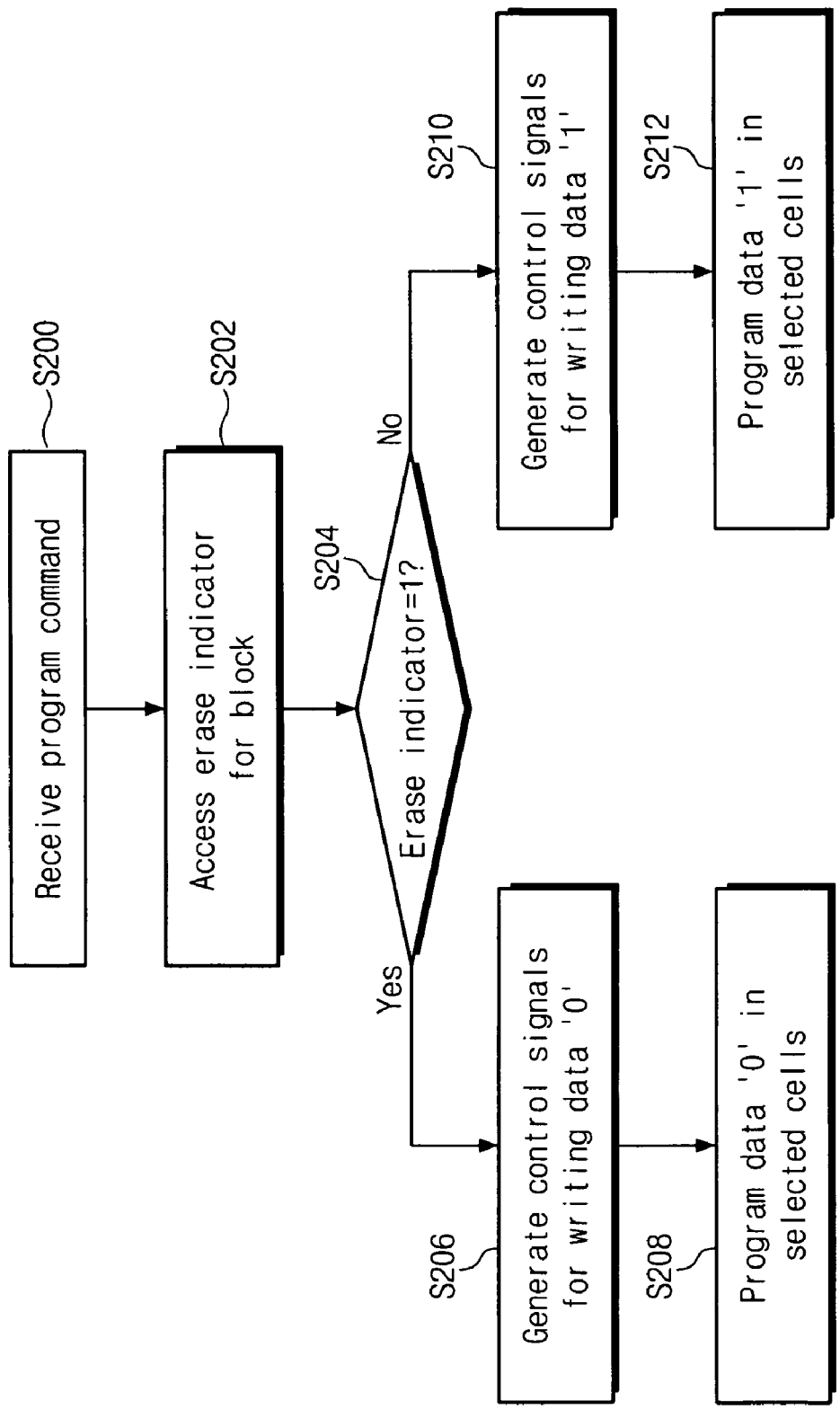
FIG. 10 illustrates a program operation according to an example embodiment.

As a compatible flash memory, the controller 150 receives a block erase command and erases the identified block as described above. Assuming the erase was performed in preparation for a write or program operation, the controller 150 then receives a program command and generates control signals for controlling operation of the write circuit 112 based on the erase indicator for the identified block. FIG. 10 illustrates a flowchart of a program operation according to one embodiment.

As shown, in step S200, the controller 150 receives a program command, and accesses the erase indicator for the block identified in the program command in step S202. In step S204, the controller 150 determines if the erase indicator indicates logic '1'. If so, then in step S206, the controller 150 generates control signals for writing data '0', and the write circuit 112 writes data '0' in selected cells in step S208. As will be recalled, the block was erased prior to this program operation. Accordingly, the memory cells were erased to the logic '1' state. Therefore, only data '0' in the write data WDATA needs to be programmed. Namely in step S208, the write circuit 112 programs the cells of the memory cell array 102 corresponding to the '0s' in the write data WDATA.

If, in step S204, the controller 150 determines the erase indicator does not indicate logic '1', then in step S210, the controller 150 generates control signals for writing data '1', and the write circuit 112 writes data '1' in selected cells in step S212. As will be recalled, the block was erased prior to this program operation. Accordingly, the memory cells were erased to the logic '0' state. Therefore, only data '1' in the write data WDATA needs to be programmed. Namely in step S212, the write circuit 112 programs the cells of the memory cell array 102 corresponding to the '1s' in the write data WDATA.

Figure 11:
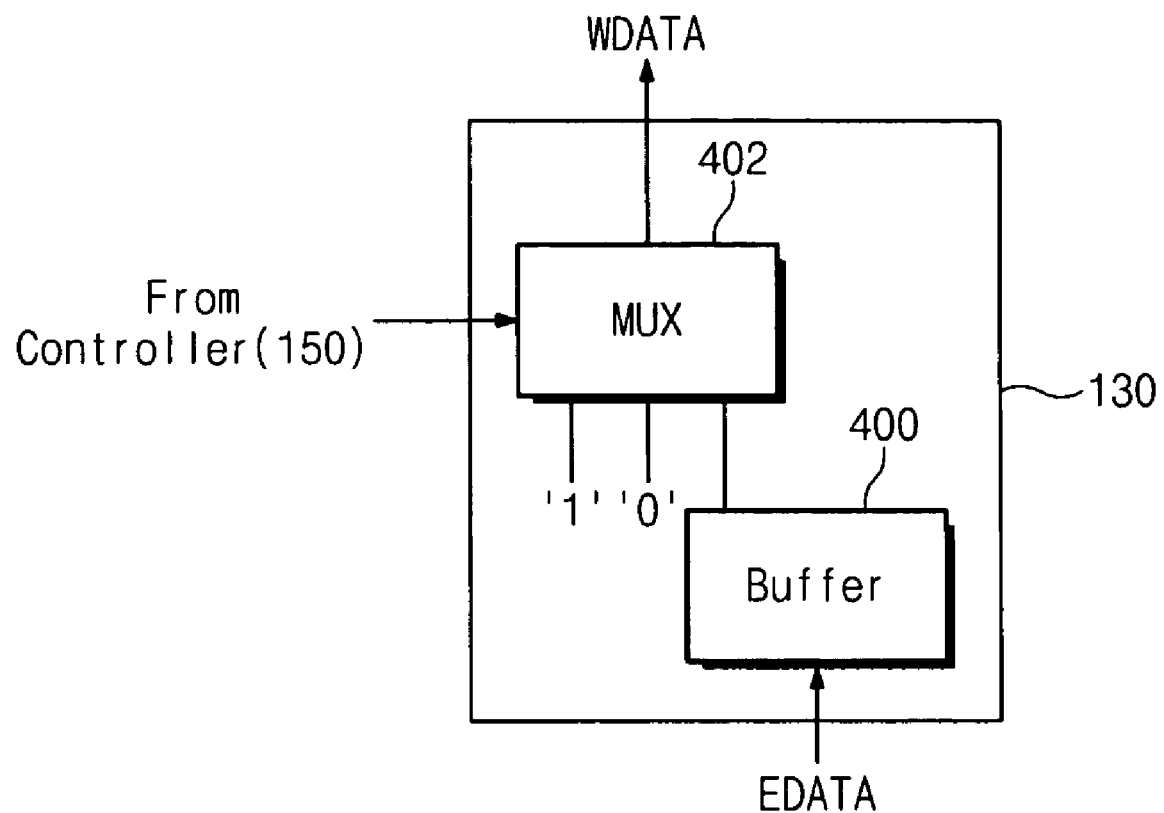
FIG. 11 illustrates an example embodiment of a data input buffer in FIG. 1.

The erase and programming operations will be described in greater detail with respect to the data input buffer 130 shown in FIG. 11 and the write circuit 112 shown in FIG. 12. FIG. 11 illustrates an example embodiment of the data input buffer 130. As shown, the data input buffer 130 includes a buffer 400 storing received external data EDATA. A multiplexer 402 outputs one of the buffered external data, a logic '0' and a logic '1' as write data WDATA under the control of the controller 150. During an erase operation to erase cells to logic '0', the controller 150 controls the multiplexer 402 to output the logic '0'. During an erase operation to erase cells to the logic '1', the controller 150 controls the multiplexer 402 to output the logic '1'. During a write or program operation, the controller 150 controls the multiplexer 402 to output the external data EDATA stored in the buffer 400.

Figure 12:
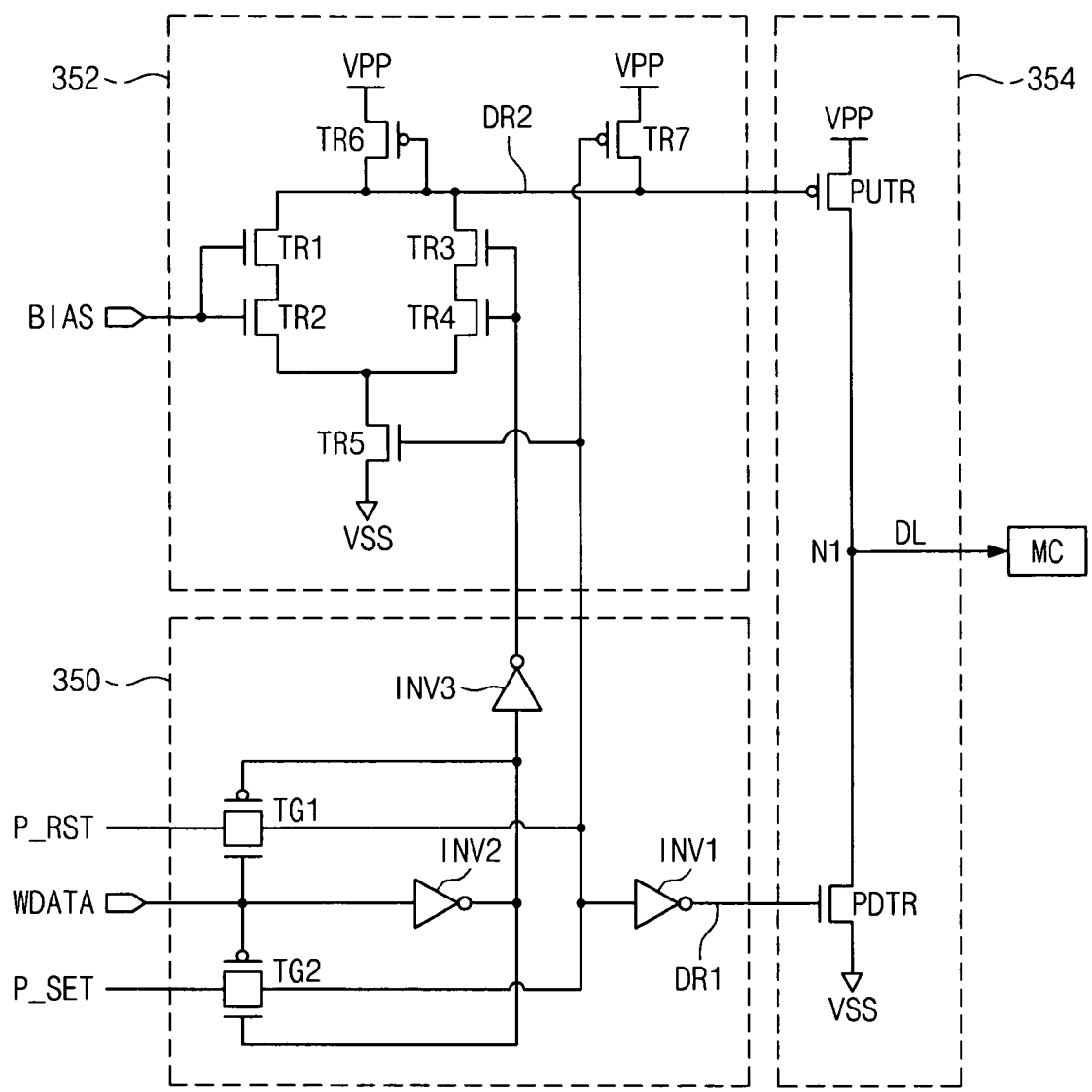
FIG. 12 illustrates an example embodiment of a write circuit in FIG. 1.

FIG. 12 illustrates an embodiment of a write circuit. As shown, the write circuit includes a pulse control circuit 350, a current control circuit 352, and a driver circuit 354. The pulse control circuit 350 includes first and second transmission gates TG1 and TG2 receiving a reset control signal P_RST and a set control signal P_SET from the controller 150. Outputs of the first and second transmission gates TG1 and TG2 are supplied to a first inverter INV1, which outputs a first drive signal on a first drive line DR1 to the driver circuit 354 and to the current control circuit 352. The pulse control circuit 350 also includes a second inverter INV2 that receives the write date WDATA from the input buffer 130. The NMOS transistors of the first and second transmission gates TG1 and TG2 receive the write data WDATA at their gates, while the PMOS transistors of the first and second transmission gates TG1 and TG2 receive the output of the second inverter INV2 at their gates. A third inverter INV3 inverts the output of the second inverter INV2.

The current control circuit 352 includes first and second NMOS transistors TR1 and TR2 connected in parallel with third and fourth NMOS transistors TR3 and TR4 between fifth transistor TR5 and a PMOS transistor TR6. The first and second NMOS transistors TR1 and TR2 receive a bias control signal from the controller 150 at their gates. The third and fourth transistors TR4 and TR5 receive the output of the third inverter INV3 at their gates. The fifth NMOS transistor TR5 is connected between ground VSS and the second and fourth transistors TR2 and TR4. The fifth NMOS transistor TR5 receives the output of the first and second transmission gates TG1 and TG2 at its gate. The PMOS transistor TR6 is connected between a power supply voltage VPP and a second drive line DR2. The first and third transistors TR1 and TR3 are also connected to the second drive line DR2. The PMOS transistor TR6 has its gate connected to the second drive line DR2. A PMOS transistor TR7 is connected between the power supply voltage and the second drive line DR2, and receives the output of the first and second transmission gates TG1 and TG2 at its gate.

The driver circuit 354 includes a PMOS drive transistor PUTR connected in series at node N1 to an NMOS drive transistor PDTR. The PMOS and NMOS drive transistors PUTR and PDTR are connected between the power supply voltage VPP and ground VSS. The gate of the NMOS drive transistor PDTR is connected to the first drive line DR1 and the gate of the PMOS drive transistor PUTR is connected to the second drive line DR2. The node N1 serves as the drive node for supplying drive current to an addressed memory cell of the memory cell array 102.

Next, operation of the write circuit 112 of FIG. 11 will be described. During an erase operation to erase cells to logic '0' as in step S146 of FIG. 6 or when programming selected cells to logic '0' as in steps S206 and S208 of FIG. 10, the controller 150 supplies a logic '1' set control signal P_SET, a logic '0' reset control signal P_RST, and a bias control signal associated with a set operation. If the write data is logic '0', the second transmission gate TG2 turns on and the first transmission gate TG1 turns off. As a result, the logic '1' set control signal P_SET is supplied to the first inverter INV1, and the gates of the fifth NMOS transistor TR5 and PMOS transistor TR7. The fifth NMOS transistor TR5 is turned on and the PMOS transistor TR7 is turned off. The first inverter INV1 inverts the set control signal P_SET to a logic '0', which turns the NMOS drive transistor PDTR off.

Also, the second and third inverters INV2 and INV3 successively invert the write data '0' such that the third and fourth transistors TR3 and TR4 are turned off. As a result, current flows through the first and second transistors TR1 and TR2 and not the third and fourth transistors TR3 and TR4. This current is mirrored through the PMOS drive transistor PUTR, and supplied to a memory cell to set the memory cell. The length that the set control signal is logic '1' controls the length of time the current is supplied.

If the write data is logic '1', the first transmission gate TG1 is turned on and the second transmission gate TG2 is turned off. However, the reset control signal P_RST is logic low so that negligible current is supplied to the memory cell because the NMOS drive transistor PDTR turns on.

During an erase operation to erase cells to logic '1' as in step S144 of FIG. 6 or when programming selected cells to logic '1' as in steps S210 and S212 of FIG. 10, the controller 150 supplies a logic '0' set control signal P_SET, a logic '1' reset control signal P_RST, and a bias control signal associated with a reset operation. If the write data is logic '1', the first transmission gate TG1 turns on and the second transmission gate TG2 turns off. As a result, the logic '1' reset control signal P_RST is supplied to the first inverter INV1, and the gates of the fifth NMOS transistor TR5 and PMOS drive transistor TR7. The fifth NMOS transistor TR5 is turned on and the PMOS drive transistor TR7 is turned off. The first inverter INV1 inverts the reset control signal P_RST to a logic '0', which turns the NMOS drive transistor PDTR off.

Also, the second and third inverters INV2 and INV3 successively invert the write data '1' such that the third and fourth transistors TR3 and TR4 are turned on. As a result, current flows through the first and second transistors TR1 and TR2 and the third and fourth transistors TR3 and TR4. This current is much greater than that during the set operation. This greater current is mirrored through the PMOS drive transistor PUTR, and supplied to a memory cell to reset the memory cell. The length that the reset control signal is logic '1' controls the length of time the current is supplied.

If the write data is logic '0', the first transmission gate TG1 is turned off and the second transmission gate TG2 is turned on. However, the set control signal P_SET is logic low so that negligible current is supplied to the memory cell because the NMOS drive transistor PDTR turns on.

A conventional flash memory erases memory cells to a logic '1' state and writes or programs selected memory cell to a logic '0' state. By setting the erase indicator to indicate the logic '1' state, the semiconductor device of the above described embodiment provides a compatible memory to flash memory. Namely, the semiconductor device operates as substitute for conventional flash memory.

Figure 15:
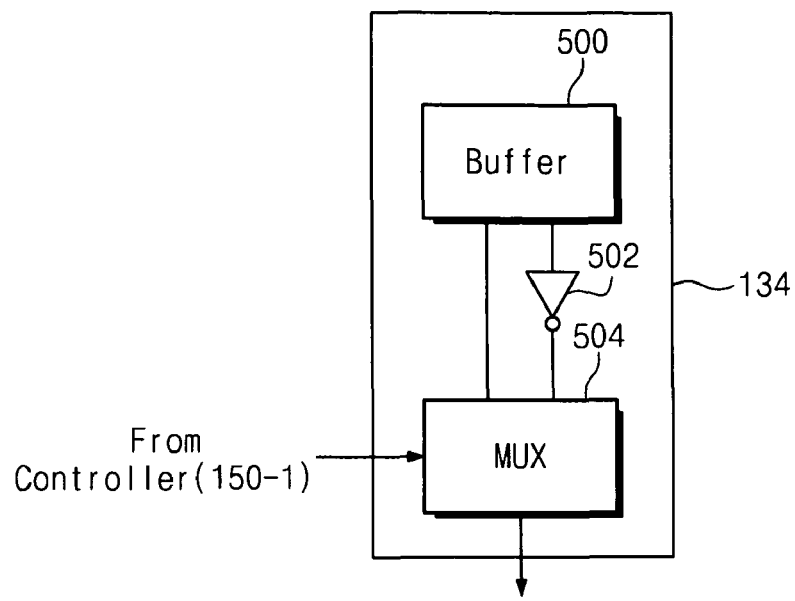
FIG. 15 illustrates an example embodiment of a data output buffer in FIG. 1.

However, programming cells to a logic '0' state may take up to 5 times longer than programming cells to a logic '1' state. Accordingly, by setting the erase indicator to indicate a logic '0' state, a programming operation may be performed five times faster. However, the stored logic states are opposite those of conventional flash memory. To provide for compatibility, the data output buffer 134 may be configured to invert the output data. In particular, the data output buffer 134 may be configured to selectively invert the output of the read unit 110 under the control of the controller 150, which is based on the erase indicator. FIG. 15 described below illustrates an example data output buffer 134. As an alternative to inverting the output data, the programming operation may be inverted.

Besides operating in a manner compatible or similar to conventional flash memory, the semiconductor device may operate non-compatible fashion. Namely, the memory cells are not erased prior to programming. Instead, logic '0' and logic '1' data are written into the memory cells by resetting and setting the memory cells. Here, the controller 150 receives the external data EDATA; generates a logic '1' reset control signal P_RST and logic '0' set control signal P_SET for logic '1' external data EDATA; and generates a logic '0' reset control signal P_RST and a logic '1' set control signal P_SET for logic '0' external data EDATA.

Figure 13:
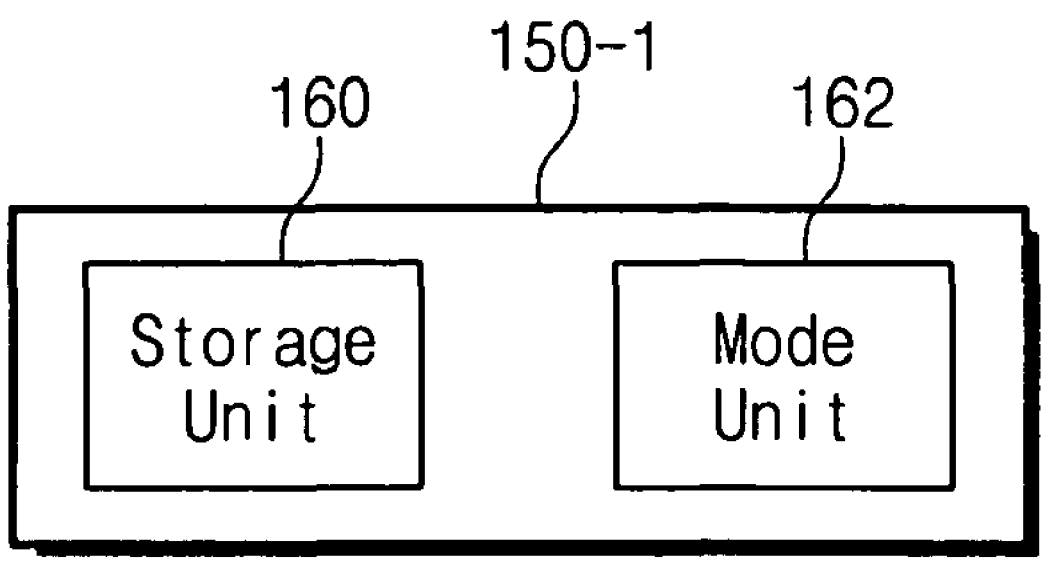
FIG. 13 illustrates another example embodiment of the controller in FIG. 1.

In another embodiment, the semiconductor device may be set in either a flash compatible mode of operation or a non-compatible mode of operation. In this embodiment, the controller 150 is replaced with the controller 150-1 shown in FIG. 13. As shown, the controller 150-1 is the same as the controller 150 except that the controller 150-1 also includes a mode unit 162. The mode unit 162 stores a mode indicator, which indicates whether the semiconductor device is to operate in a flash compatible mode or a non-compatible mode. For example, the mode indicator may be a single bit. If set to '1' the mode indicator indicates the flash compatible mode, and if set to '0' the mode indicator indicates the non-compatible mode. The mode unit 162 may include a register. The mode indicator may be set in any manner. For example, the mode indicator may be programmable by applying a command or mode register set such that, in response, the controller 150-1 programs a received, desired mode indicator in the mode unit 162. The mode indicator may also be set in other ways such as through fuses, etc. Instead of the controller 150-1 receiving and programming the mode indicator in the mode unit 162, the mode unit 162 may directly receive a mode register set to program the mode indicator.

Figure 14:
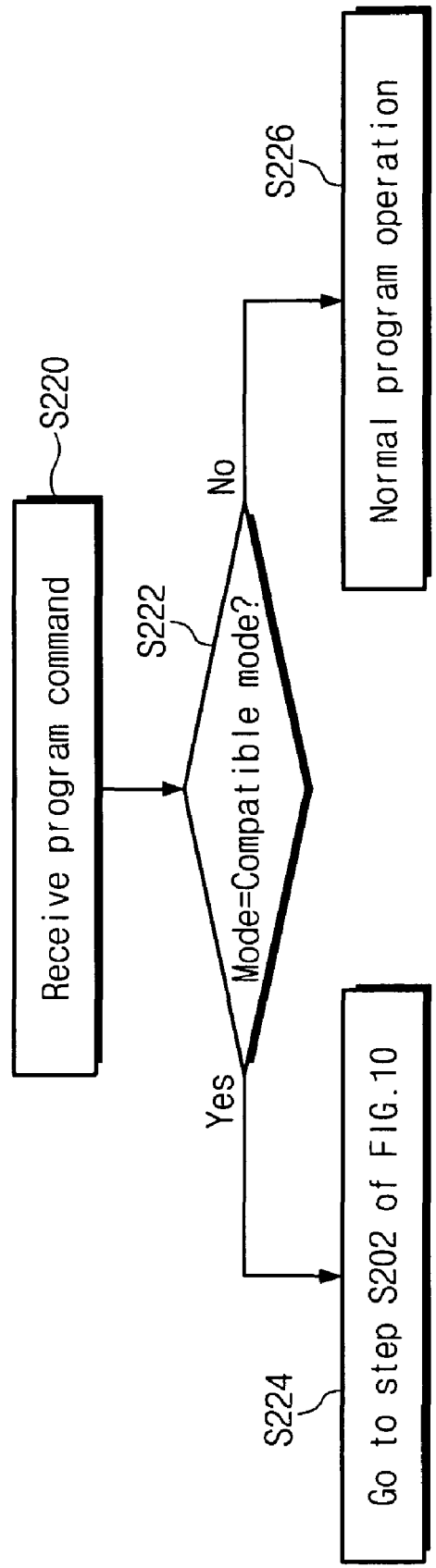
FIG. 14 illustrates an example embodiment of a program operation.

FIG. 14 illustrates a flexible operation according to an example embodiment. As shown, the controller 150-1 receives a program command in the same manner as discussed above with respect to step S200. Next, the controller 150-1 determines if the operation mode is the flash compatible mode in step S222. For example, the controller 150-1 accesses the mode indicator from the mode unit 162. If the mode indicator equals '1', then the controller 150-1 determines that the operation mode is the flash compatible mode. If the flash compatible mode is determined, then in step S224 operation proceed in the same manner as described above with respect to FIG. 10 beginning with step S202. However, if the mode indicator does not equal '1', then the controller 150-1 determines that the mode is not the flash compatible mode, and normal programming operation takes place in step S226. As discussed above, in step S226, the controller 150 receives the external data EDATA; generates a logic '1' reset control signal P_RST and logic '0' set control signal P_SET for logic '1' external data EDATA; and generates a logic '0' reset control signal P_RST and a logic '1' set control signal P_SET for logic '0' external data EDATA. The write circuit 112 then operates in accordance with the control signals as described in detail above with respect to FIG. 12.

In this embodiment, FIG. 15 illustrates an embodiment of the data output buffer. As shown, the data output buffer 134 includes a buffer 500 that stores data read from the memory cell array 102 by the read unit 110. A multiplexer 504 receives the buffered data and the buffered data inverted by an inverter 502. The multiplexer 504 selectively outputs the read data or the inverted read data under the control of the controller 150-1. If the mode is the non-compatible mode, the controller 150-1 controls the multiplexer to output the data from the buffer 500. If the mode is the flash compatible mode, the controller 150-1 controls the multiplexer 504 based on the erase indicator associated with the portion of the memory cell array being read. If the erase indicator indicates the erase state is logic '1', then the controller 150-1 controls the multiplexer 504 to output the read data from the buffer 500. If the erase indicator indicates the erase state is logic '0', then the controller 150-1 controls the multiplexer 504 to output the inverted read data from the inverter 502.

Figure 16:
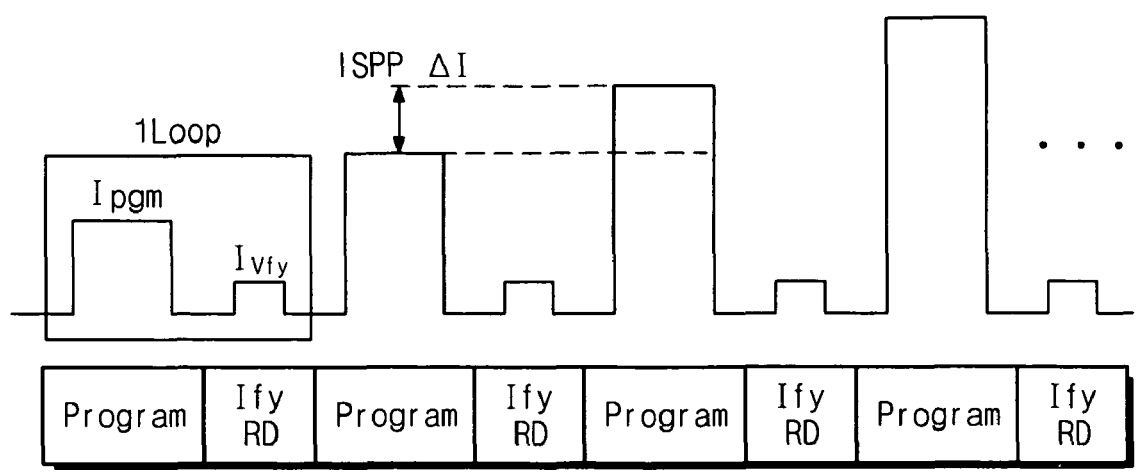
FIG. 16 illustrates a program loop including a plurality of unit program loops using an ISPP method.

It will further be appreciated that the write operation in any of the above embodiments may be a incremental program pulse (ISPP) method as shown in FIG. 16. In particular, FIG. 16 illustrates a program loop including a plurality of unit program loops using an ISPP method. As illustrated in FIG. 16, one unit program loop may include a program operation and a verify read operation. In the program operation, a program current or current waveform Ipgm may be applied to a memory cell. While shown as a simple square wave, it will be appreciated that the program current waveform may be of a shape to either set or reset the phase change material in the memory cell Cp. In the verify read operation, a verify current Ivfy may be applied to the selected memory cell. In ISPP fashion, the program current Ipgm may be increased by a delta current for each unit program loop. Once the verify read operation verifies that data has been properly written, the program loops ends, and the write operation ends. Namely, until verified the write operation is not complete.

It will be understood that FIG. 16 is but one example method of ISPP and that any ISPP method may be used to in the write operation. For example, instead or in addition to adjusting the current magnitude, the duration the current is applied may be changed. Still further, instead of or in additional to the current magnitude and/or the current duration, the waveform shape may be changed.

Application Embodiments

Figure 17:
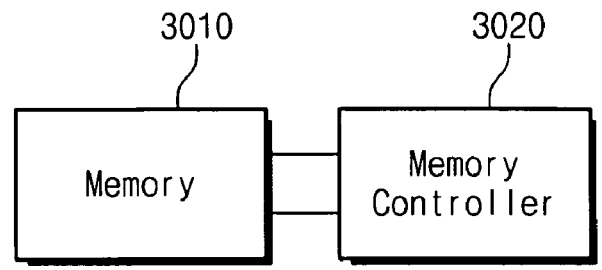
FIGS. 17-22 illustrate example embodiments of applications of the semiconductor device.

FIG. 17 illustrates an example embodiment of an application of the semiconductor device. As shown, this embodiment includes a memory 3010 connected to a memory controller 3020. The memory 3010 may be any of the semiconductor device embodiments described above. The memory controller 3020 supplies the input signals for controlling operation of the memory 3010. For example, the memory controller 3020 supplies the command CMD and address signals.

Figure 18:
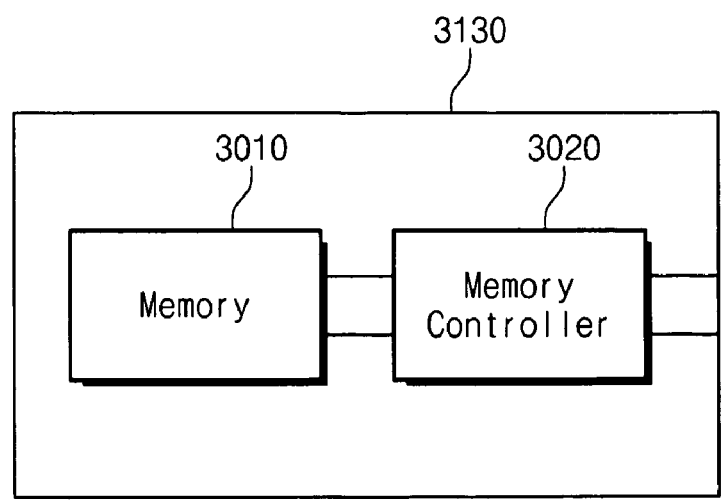

FIG. 18 illustrates yet another embodiment. This embodiment is the same as the embodiment of FIG. 17, except that the memory 3010 and memory controller 3020 have been embodied as a card 3130. For example, the card 3130 may be a memory card such as a flash memory card. Namely, the card 3130 may be a card meeting any industry standard for use with a consumer electronics device such as a digital camera, personal computer, etc. It will be appreciated that the memory controller 3020 may control the memory 3010 based on controls signals received by the card 3130 from another (e.g., external) device.

Figure 19:
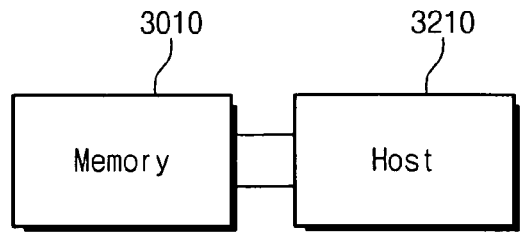

FIG. 19 illustrates a still further embodiment of the present invention. As shown, the memory 3010 may be connected with a host system 3210. The host system 3210 may be a processing system such as a personal computer, digital camera, etc. The host system 3210 may use the memory 3010 as a removable storage medium. As will be appreciated, the host system 3210 supplies the input signals for controlling operation of the memory 3010. For example, the host system 3210 supplies the command CMD and address signals.

Figure 20:
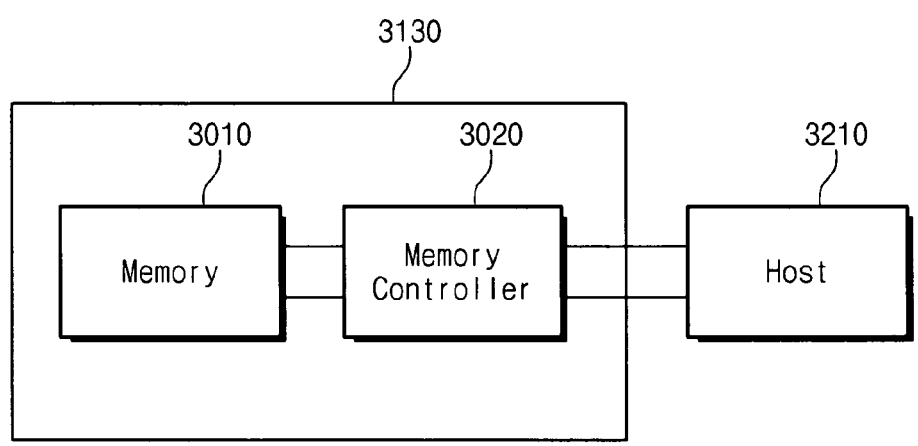

FIG. 20 illustrates an embodiment of the present invention in which the host system 3210 is connected to the card 3130 of FIG. 18. In this embodiment, the host system 3210 applies control signals to the card 3130 such that the memory controller 3020 controls operation of the memory 3010.

Figure 21:
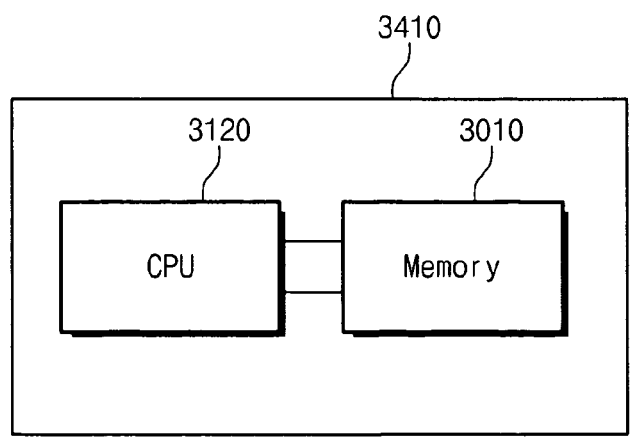

FIG. 21 illustrates a further embodiment of the present invention. As shown, the memory 3010 may be connected to a central processing unit (CPU) 3420 within a computer system 3410. For example, the computer system 3410 may be a personal computer, personal data assistant, etc. The memory 3010 may be directly connected with the CPU 3420, connected via a bus, etc. It will be appreciated, that FIG. 20 does not illustrate the full complement of components that may be included within a computer system 3410 for the sake of clarity.

Figure 22:
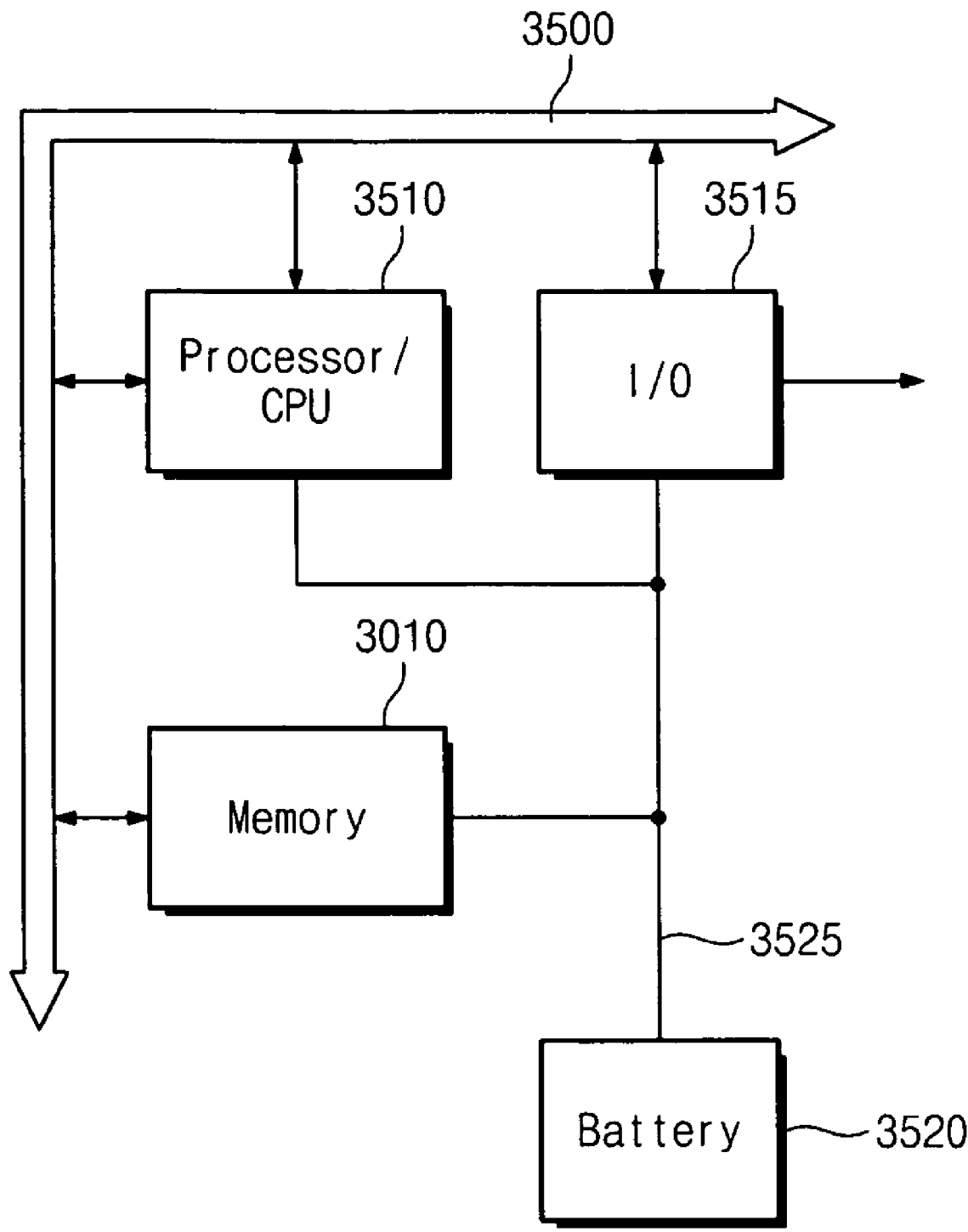

FIG. 22 illustrates another embodiment of the present invention. FIG. 22 may represent another portable application of the semiconductor device embodiments described above. As shown, this embodiment includes the memory 3010, which may be any of the semiconductor device embodiments described above. In this and any of the previous embodiments, the memory 3010 may include one or more integrated circuit dies where each die has a memory array that operates according to the various embodiments. These IC dies may be separate, stand alone memory devices that are arranged in modules such as conventional dynamic random access memory (DRAM) modules, or they may be integrated with other on-chip functionalities. In the latter embodiments, the memory 3010 may be part of an I/O processor or a microcontroller as described above.

This and the other portable application embodiments may be for instance a portable notebook computer, a digital still and/or video camera, a personal digital assistant, a mobile (cellular) hand-held telephone unit, navigation device, GPS system, audio and/or video player, etc. Of course, there are other non-portable applications for the memory 3010. These include, for instance, large network servers or other computing devices which may benefit from a non-volatile memory device.

As shown in FIG. 22, this embodiment includes a processor or CPU 3510 that uses the memory 3010 as program memory to store code and data for its execution. Alternatively, the memory 3010 may be used as a mass storage device for non-volatile storage of code and data. The portable application embodiment may communicate with other devices, such as a personal computer or a network of computers via an I/O interface 3515. This I/O interface 3515 may provide access to a computer peripheral bus, a high speed digital communication transmission line, or an antenna for unguided transmissions. Communications between the processor and the memory 3010 and between the processor 3510 and the I/O interface 3515 may be accomplished using conventional computer bus architectures as represented by bus 3500 in FIG. 22. Furthermore, the present invention is not limited to this architecture. For example, the memory 3010 may be replaced with the embodiment of FIG. 18, and communication with the processor 3510 may be via the memory controller 3020. Furthermore, the I/O interface 3515 may communicate with the memory 3010 via the memory controller 3020, or directly with the memory 3010 if the memory controller 3020 is not present. In portable applications, the above-described components are powered by a battery 3520 via a power supply bus 3525.

Figure 23:
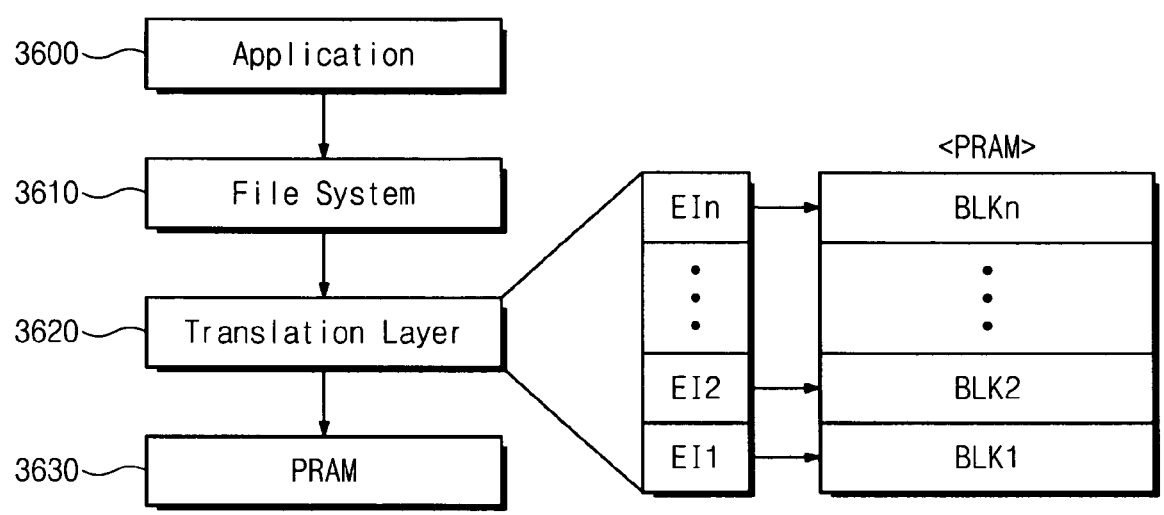
FIG. 23 illustrates an example file system associated with a memory system including an embodiment of the present invention.

FIG. 23 illustrates an example file system associated with a memory system including an embodiment of the present invention. As shown, the hierarchical structure of a memory system includes an application 3600, a file system 3610, a translation layer 3620 and a variable resistive memory 3630. The resistive memory 3630 may be a memory according to any of the above-described embodiments. The application 3600 sends requests such as read, write, etc. to the file system 3610, and the file system 3610 sends the addresses in the requests to the translation layer 3620. The translation layer 3620 converts the receive address (e.g., a logical address) to a physical address of the memory 3630. In addition, the translation layer 3620 may manage the erase indicators of the memory 3620. Namely, management of the erase indicators may be duplicated in the translation layer 3620, or removed from the controller 150 and replaced with the translation layer 3620. In this later embodiment, the translation layer 3620 may supply the erase indicator to the memory 3630 along with the physical address, etc. Still further, in either embodiment, the translation layer 3620 may communicate the erase indicator to the file system 3610 and/or application 3600. In addition to the above, the translation layer 3620 may also manage the mode (flash compatible or not) as a duplicate or replacement of the controller 150.

The invention being thus described, it will be obvious that the same may be varied in many ways. Such variations are not to be regarded as a departure from the invention, and all such modifications are intended to be included within the scope of the invention.

We claim:

1. A semiconductor device, comprising:
   a non-volatile memory cell array;
   a write circuit configured to write to the non-volatile memory cell array; and
   a control circuit configured to store at least one erase indicator, the erase indicator associated with at least a portion of the non-volatile memory cell array and indicating a logic state;
   the control circuit configured to control the write circuit to write the logic state indicated by the erase indicator in the non-volatile memory cell array during an erase operation of the associated portion of the non-volatile memory cell array.

2. The semiconductor device of claim 1, wherein the control circuit is configured to store a single erase indicator, which is associated with the non-volatile memory cell array.

3. The semiconductor device of claim 1, wherein
   the non-volatile memory cell array is divided into a plurality of portions; and
   the control circuit is configured to store an erase indicator associated with each portion.

4. The semiconductor device of claim 3, wherein the non-volatile memory cell array is divided into at least one bank, each bank is divided into a plurality of blocks of memory cells, and the control circuit is configured to store an erase indicator associated with each bank.

5. The semiconductor device of claim 3, wherein the non-volatile memory cell array is divided into at least one bank, each bank is divided into a plurality of blocks of memory cells, and the control circuit is configured to store an erase indicator associated with each block.

6. The semiconductor device of claim 1, wherein the control circuit is configured to store the erase indicator based on input signals.

7. The semiconductor device of claim 1, wherein the control circuit is programmable.

8. The semiconductor device of claim 1, wherein the control circuit is configured to control the write circuit to write logic '0' in response to an input program command if the erase indicator indicates logic '1'.

9. The semiconductor device of claim 8, wherein the control circuit is configured to control the write circuit to write logic '1' in response to an input program command if the erase indicator indicates logic '0'.

10. The semiconductor device of claim 1, wherein the control circuit is configured to control the write circuit to write logic '1' in response to an input program command if the erase indicator indicates logic '0'.

11. The semiconductor device of claim 10, wherein the control circuit is configured to control selective inversion of input data for a write operation based on the erase indicator.

12. The semiconductor device of claim 11, wherein the control circuit is configured to cause inversion of the input data for the write operation if the erase indicator indicates a logic '0'.

13. The semiconductor device of claim 10, further comprising:
   an output circuit configured to invert data read from the non-volatile memory cell array if the erase indicator indicates logic '0'.

14. The semiconductor device of claim 1, wherein
   the control circuit is configured to selectively operate in a flash compatible mode and a non-flash compatible mode;
   in the flash compatible mode, the control circuit is configured to control the write circuit to write logic '0' in response to an input program command if the erase indicator indicates logic '1'.

15. The semiconductor device of claim 14, wherein the control circuit is configured to control selective inversion of input data for a write operation based on at least one of whether operating in the flash compatible mode and the erase indicator.

16. The semiconductor device of claim 15, wherein the control circuit is configured to cause inversion of the input data for the write operation if operating in the flash compatible mode and the erase indicator indicates a logic '0'.

17. The semiconductor device of claim 14, further comprising:
   an output circuit configured to invert data read from the non-volatile memory cell array if operating in the flash compatible mode and the erase indicator indicates logic '0'.

18. The semiconductor device of claim 1, wherein the control circuit includes a storage unit configured to store the erase indicator.

* * * * *